(12) United States Patent
Haruyama

(10) Patent No.: US 6,731,916 B1
(45) Date of Patent: May 4, 2004

(54) POWER AMPLIFYING APPARATUS FOR MOBILE PHONE

(75) Inventor: Shinichi Haruyama, Yokohama (JP)

(73) Assignee: Samsung Electronics Co., Ltd., Suwon-Si (KR)

( * ) Notice: Subject to any disclaimer, the term of this patent is extended or adjusted under 35 U.S.C. 154(b) by 332 days.

(21) Appl. No.: 09/653,146

(22) Filed: Aug. 31, 2000

(30) Foreign Application Priority Data

Aug. 31, 1999 (JP) ............................................ 11/246435

(51) Int. Cl.⁷ .............................. H04B 1/16; H03G 3/10
(52) U.S. Cl. .............................. 455/194.2; 455/127.3; 455/550; 455/116; 330/285
(58) Field of Search .............................. 455/550, 115, 455/126, 127.3, 194.2, 116; 330/285

(56) References Cited

U.S. PATENT DOCUMENTS

| | | | |
|---|---|---|---|
| 5,142,240 A | | 8/1992 | Isota et al. ................... 330/149 |
| 5,420,536 A | | 5/1995 | Faulkner et al. ............. 330/149 |
| 5,920,808 A | * | 7/1999 | Jones et al. ............... 455/127.1 |
| 6,049,704 A | * | 4/2000 | Peckham et al. ......... 455/232.1 |
| 6,148,220 A | * | 11/2000 | Sharp et al. ................... 455/572 |
| 6,356,745 B1 | * | 3/2002 | Lee et al. ................. 455/232.1 |
| 6,434,373 B2 | * | 8/2002 | Ichihara ...................... 455/127 |
| 6,600,792 B2 | * | 7/2003 | Antonio et al. ............. 375/297 |

* cited by examiner

Primary Examiner—William Trost
Assistant Examiner—Sharad Rampuria
(74) Attorney, Agent, or Firm—Cha & Reiter, L.L.C.

(57) ABSTRACT

A power amplifying apparatus for a mobile phone is provided. In the power amplifying apparatus, a power amplifier uses a transistor as a power amplifying device, and a non-volatile memory pre-records the static characteristic measurement data of the transistor. A DC bias current of the transistor is controlled according to transmission power of the power amplifier referring to the static characteristic measurement data, by changing a gate voltage of the transistor, by changing a drain voltage of the transistor with the gate voltage fixed, or by changing both the gate voltage and the drain voltage.

8 Claims, 5 Drawing Sheets

POWER AMPLIFYING APPARATUS FOR MOBILE PHONE

CLAIM OF PRIORITY

This application makes reference to and claims all benefits accruing under 35 U.S.C. Section 119 from an application entitled, "Power Amplifying Apparatus for Mobile Phone", filed in the Japanese Patent Office on Aug. 31, 1999 and there duly assigned Serial No. 1999-246435.

BACKGROUND OF THE INVENTION

1. Field of the Invention

The present invention relates generally to an apparatus for extending the battery life in a mobile communication system. More particularly, the present invention relates to a power amplifying apparatus for a Wideband-Code Division Multiple Access (W-CDMA) mobile phone.

2. Description of the Related Art

In order to save the battery life, a power control scheme is used in that the distance between a mobile phone and a base station is estimated so that the mobile phone can adjust its transmitting power to achieve at least minimum required E/I at the receiver. To this end, the mobile phone monitors its reception power to determine how much transmission power is to be adjusted. FIG. 3 illustrates a conventional structure of a power amplifying apparatus of a mobile phone. In FIG. 3, a high power amplifier (HPA) 21 amplifies the power of an input signal under the control of an automatic power controller (APC) 23 and feeds the amplified signal to a transmission antenna 24. A power monitor 22 serves to monitor the transmission power received from the HPA 21. The APC 23 controls the transmission power of the HPA 21 according to the output information received from a digital signal processor (DSP: not shown) of a phone, or from the output information from a controlling Central Processing Unit (CPU) (not shown) and the output monitor 22. The output information comprises a DC signal, which is produced from a digital signal output from the DSP or the CPU via a digital-to-analog conversion (DAC) process. Then, the DC signal is used to control the transmitting power of the mobile phone.

The power added efficiency (PAE) of the HPA 21 is used to determine power consumption efficiency, thus it is an important factor in determining the life span of a battery. FIGS. 4 and 5 illustrate graphs showing the relationship between the input/output power characteristics and the PAE. For example, FIG. 4 shows the relative power consumption information when a GaAs-FET is used as the HPA 21. In such a case, the maximum PAE is obtained in the vicinity of the peak transmission power, as shown in FIG. 4. On an average usage of a mobile phone, a majority of the time is passed in a standby mode requiring less power consumption, thereby extending the battery life time. However, when voice transmission is required from the time to time, the peak transmission power, depending on the transmission environment, is required.

In view of foregoing in recent years, various suggestions have been made to extend the life span of the battery by adjusting the bias current and gate-source voltage. As shown in FIG. 5, a DC bias current flowing through the HPA 21 is adjusted based on the output of the HPA 21. Curves P1, P2, and P3 correspond to the output power with respect to E1, E2, and E3 (PAE). P1 and E1 represent power conversion efficiency for a relatively low DC bias current, whereas P3 and E3 represent for a relatively high DC bias current.

In recent years, there has been an increasing tendency of employing power amplifiers using a GaAs-FET, a transistor having high power conversion efficiency. With reference to FIG. 6, static characteristics differ in GaAs-FETs caused by changes in the manufacturing process. That is, the static characteristics, such as pinch-off voltage and drain saturated current, are greatly changed due to the manufacturing differences. To control the drain current (Id) as shown in FIG. 6 to a drain current of a design value, the individual difference in the static characteristics of different amplification transistors should be minimized. However, this is impossible in the current situation. Moreover, to obtain an ideal amplification transistors having a desired characteristic for the operation of amplifier, the manufacturing cost has to increased significantly because a large volume of transistors has to be produced to achieve few transistors exhibiting the ideal static characteristics.

SUMMARY OF THE INVENTION

It is, therefore, one object of the present invention is to provide an amplifier that resolves the above shortcomings in such way that the PAE of the power amplifier during a standby mode is increased.

It is, therefore, an object of the present invention to provide a power amplifying apparatus for a mobile phone which can increase the life span of a battery in a normal use state, by precisely controlling the DC bias current that determines the PAE of the power amplifier.

The above object can be achieved by providing a power amplifying apparatus, which uses a transistor as a power amplifying device, wherein a non-volatile memory records the static characteristic measurements of the transistor. The DC bias current of the transistor is controlled according to transmission power of the power amplifier by referring to the pre-recorded static characteristic measurement data, by changing the gate voltage of the transistor or by changing a drain voltage of the transistor having the gate voltage fixed, or by changing both the gate voltage and the drain voltage.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. For the purpose of clarity, well-known functions or constructions are not described in detail as they would obscure the invention in unnecessary detail.

Figure 1:
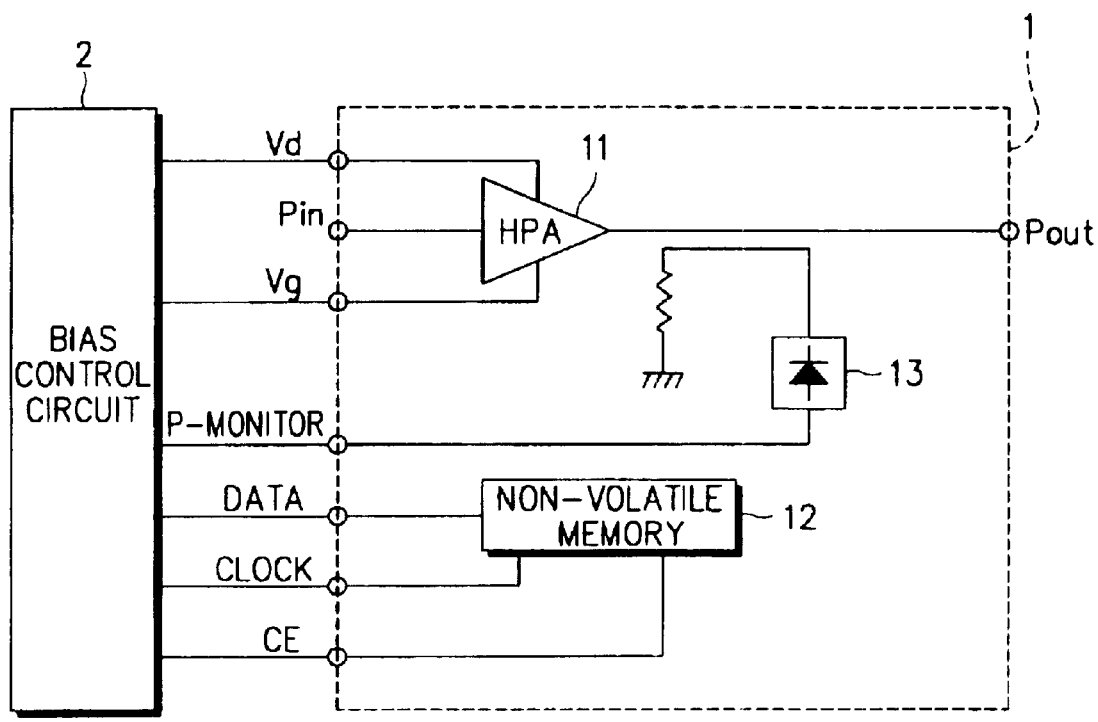
FIG. 1 is a schematic view of a power amplifying apparatus for a mobile phone according to the embodiment of the present invention.

FIG. 1 is a schematic view of a power amplifying apparatus (hereinafter, referred to as an HPA module) for a mobile phone according to the present invention. In FIG. 1, an HPA 11, a non-volatile memory 12, and an output monitor 13 are incorporated in the HPA module 1 as one chip. GaAs-FET is used as a power amplifying device for the HPA 11 that includes a bias current setting circuit later described herein. An EEPROM (Electrically Erasable Programmable Read Only Memory) is used as the non-volatile memory 12, by way of example.

Figure 6:
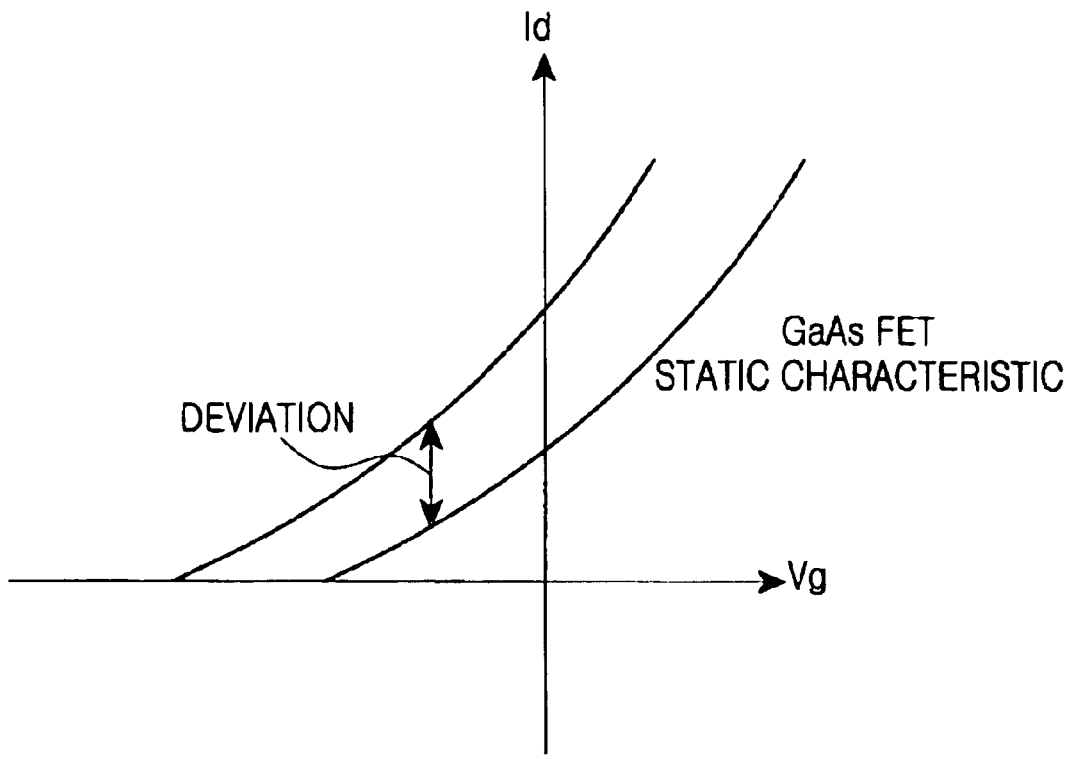

The static characteristic information of the GaAs-FET is pre-recorded in the non-volatile memory 12. Specifically, the static characteristic of the GaAs-FET, that is, its Vg-Id characteristic as shown in FIG. 6 is measured, plotted to 16 (=$2^4$) kinds of data when a 4-bit EEPROM is used, and recorded in the non-volatile memory 12 before the HPA module 11 comes into the market.

In FIG. 1, Vd (drain voltage), Pin (input voltage), Vg (gate voltage), P-monitor (power monitor), Data (data), clock (clock signal), CE (chip enable), and Pout (output power) are the input/output terminals of the HPA module 1. When the HPA module 1 is used as a power amplifying apparatus for a mobile phone, Vd, Pin, Vg, P-monitor, Data, clock, and CE are connected to a bias control circuit 2 outside the HPA module 1. The bias control circuit 2 can be implemented using a phone DSP or a controlling CPU.

Figure 2:
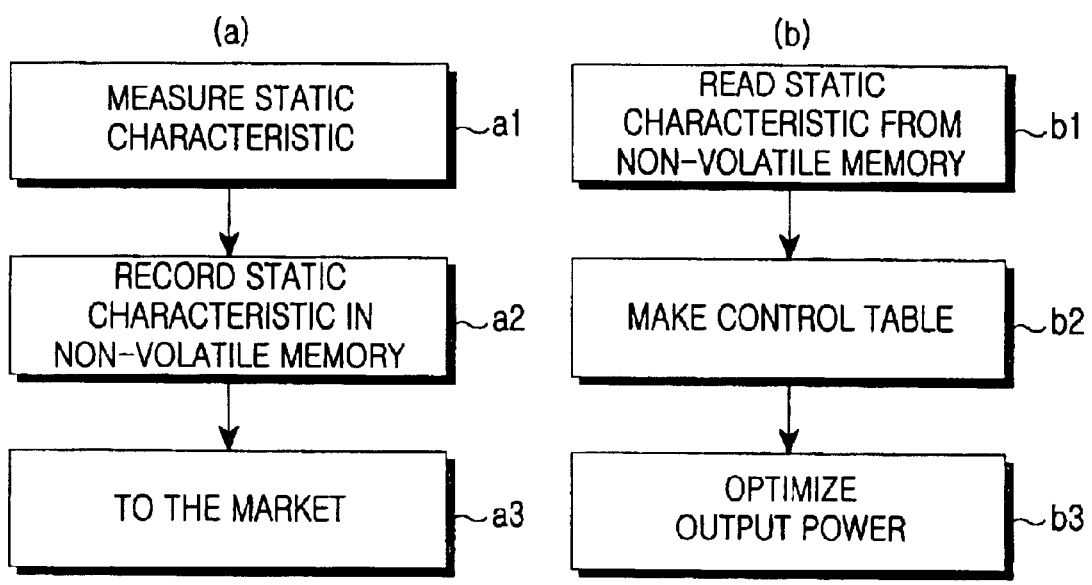
FIG. 2A is a flowchart illustrating the preliminary process by a manufacturing company of the power amplifying apparatus shown in FIG. 1.
FIG. 2B is a flowchart illustrating the operation of a bias controller shown in FIG. 1.
Figure 3:
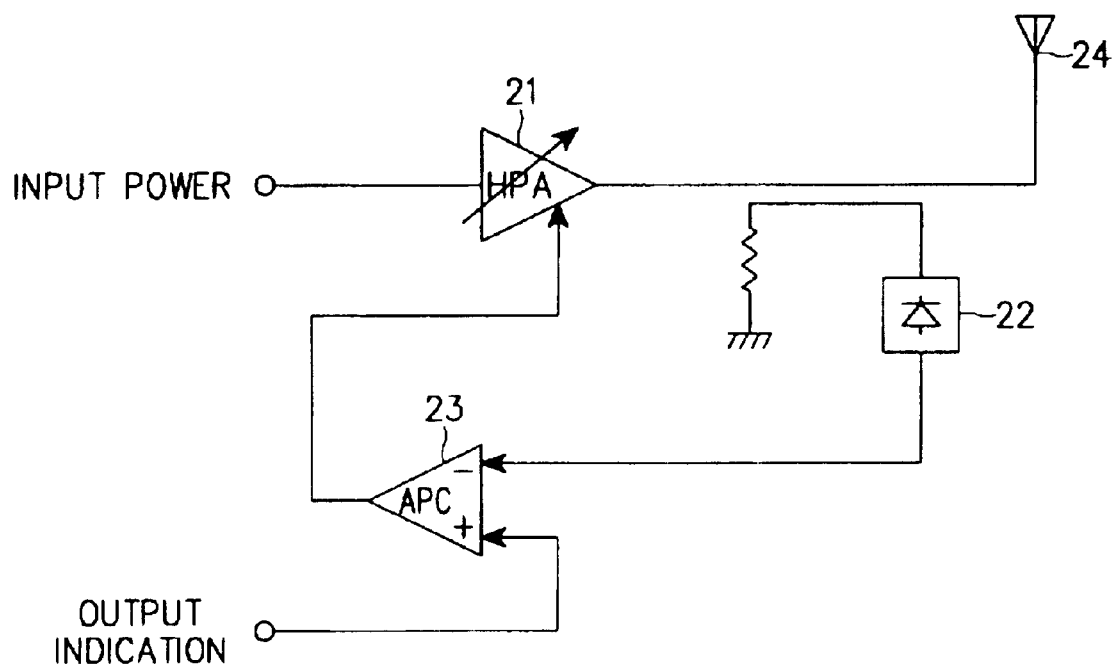
FIG. 3 illustrates the structure of a power amplifying apparatus in a conventional mobile phone.
Figure 4:
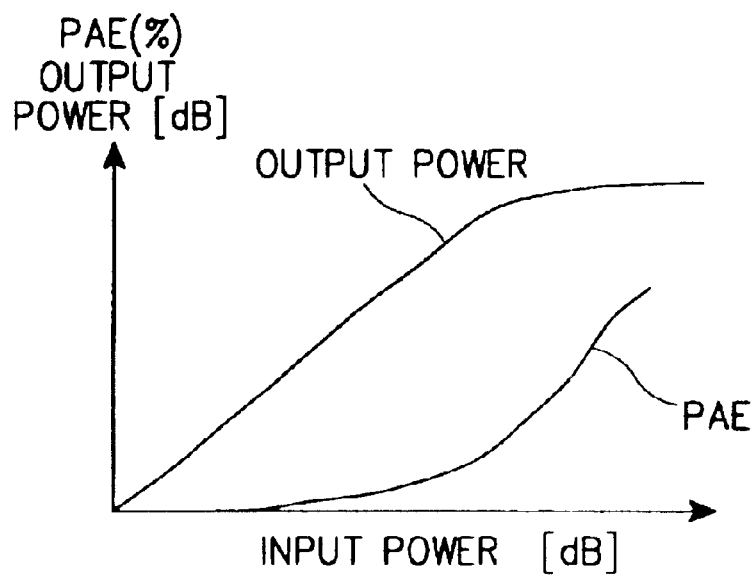
FIG. 4 is a graph showing the relationship between input/output power characteristics and the PAE in an HPA.
Figure 5:
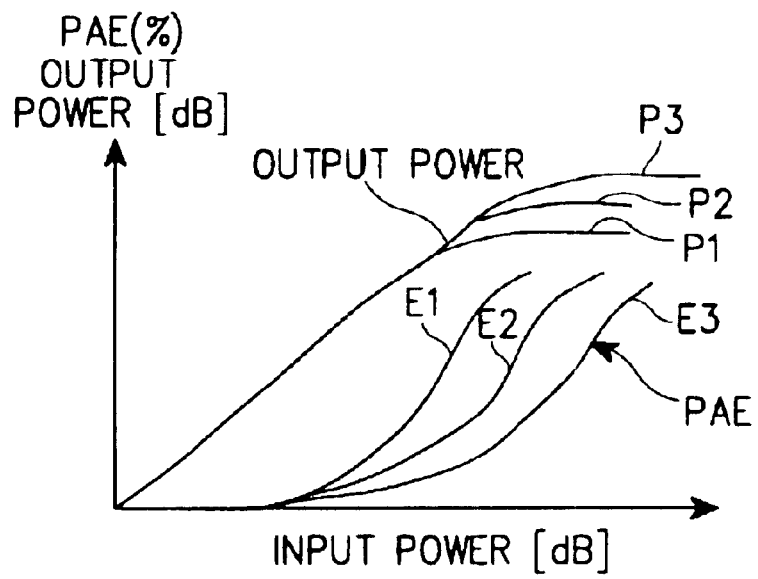
FIG. 5 is a graph showing the relationship between input/output power characteristics and the PAE in an HPA when a DC bias current of the HPA is controlled according to the HPA output; and, FIG. 6 is a graph showing static characteristic data of GaAs-FETs, when used as power amplifying devices for the HPA.

FIG. 2A illustrates an operation of manufacturing the HPA module 1 shown in FIG. 1, and FIG. 2B illustrates a flowchart illustrating the operation of the bias control circuit 2 when the HPA module 1 is used as a power amplifying apparatus for a mobile phone.

Referring to FIGS. 2A and 2B, the non-volatile memory 12 is incorporated in the HPA module 1, as stated above. Before the HPA module 1 comes onto the market, the static characteristics of the GaAs-FET (HPA 11) are measured in step a1. The measured static characteristics are recorded in the non-volatile memory 12 in step a2. In step a3, the HPA module 1 is put on the market.

When the HPA module 1 is used as a power amplifying apparatus for a mobile phone, the bias control circuit 2 reads data from the non-volatile memory 12 in step b1, makes a control table in step b2, and optimizes the output power of the HPA 11 according to the contents of the control table in step b3.

Optimization of the output power refers to controlling the output power based on the individual static characteristics of the GaAs-FET retrieved from the non-volatile memory 12. In other words, the bias control circuit 2 changes the drain voltage Vd or the gate voltage Vg applied to the HPA 11 by controlling the DC bias current flowing through the HPA 11 based on the output power (Pout) of the HPA 11 monitored by the output monitor 13.

Specifically, the bias control circuit 2 reads the static characteristics of the GaAs-FET (i.e., the Vg-Id characteristic shown in FIG. 6) from the non-volatile memory 12, then generates a control for setting a DC bias current based on the read static characteristic information, and controls the DC bias current so as to maximize the PAE according to the generated control table. Consequently, the output power of the HPA 11 is optimized. It should be noted that there are well known methods in the art in generating such table.

The DC bias current can be controlled in three ways: (1) by changing the gate voltage Vg; (2) by changing the drain voltage Vd with the gate voltage Vg fixed; and, by changing both the gate voltage Vg and the drain voltage Vd.

Using one of the above three methods, the output power of the HPA 11 is optimized since the static characteristics of the GaAs-FET is already considered and the right current value is selected to provide a maximum PAE. Hence, the control table made in the bias control circuit 2 varies depending on which method is used.

When the DC bias current is controlled by changing the gate voltage Vg, the control table is follows:

TABLE 1

| gate voltage Vg | DC bias current | PAE |
|---|---|---|
| $V_g1$ | $i_k1$ | k1 |
| $V_g2$ | $i_k2$ | k2 |
| $V_g3$ | $i_k3$ | k3 |
| $V_g4$ | $i_k4$ | k4 |

When the DC bias current is controlled by changing the drain voltage Vd with the gate voltage Vg fixed, the control table is as follows:

TABLE 2

| drain voltage Vd | DC bias current | PAE |
|---|---|---|
| $V_d1$ | $i_k1$ | k1 |
| $V_d2$ | $i_k2$ | k2 |
| $V_d3$ | $i_k3$ | k3 |
| $V_d4$ | $i_k4$ | k4 |

When the DC bias current is controlled by changing the gate voltage Vg and the drain voltage Vd, the control table is as follows:

TABLE 3

| gate voltage Vg | drain voltage Vd | DC bias current | PAE |
|---|---|---|---|
| $V_g1$ | $V_d1$ | $i_k1$ | k1 |
| $V_g1$ | $V_d2$ | $i_k2$ | k2 |
| $V_g1$ | $V_d3$ | $i_k3$ | k3 |
| $V_g2$ | $V_d1$ | $i_k4$ | k4 |
| $V_g2$ | $V_d2$ | $i_k5$ | k5 |
| $V_g2$ | $V_d3$ | $i_k6$ | k6 |
| . | . | . | . |
| . | . | . | . |
| . | . | . | . |

In case the DC bias current is controlled by varying the gate voltage Vg, a gate voltage Vg that maximizes the PAE is selected referring to the control table of Table 1 and applied to the HPA 11, thereby optimizing the output power of the HPA 11.

The DC bias current applied by the bias control circuit 2 based on the drain voltage Vd and/or gate voltage Vg flows through the HPA II through the bias current setting circuit. The structure of the bias current setting circuit is well known, thus its detailed description is omitted here.

The consumption power of the HPA module 1 is defined as the product of a DC bias current and a power supply voltage. If the DC bias current is constant as in the prior art system, the HPA module 1 consumes power that is almost constant despite having low output power. To increase the average PAE of the HPA module 1, it is important to increase its PAE during a standby mode requiring less output power. This implies that if the output power level is set to a low level, the DC bias current is also set to be a low value, for example, by setting the drain voltage Vd to increase the PAE.

As described above, according to the present invention, since the transistor is used for a bias circuit and the transistor characteristic caused by changes in the manufacturing process exist, the present invention pre-records the static characteristic for each transistor so that an optimal PAE can be achieved by adjusting the drain current or gate voltage, or both, accordingly.

Also, the DC bias current can be precisely controlled by increasing the capacity of the non-volatile memory 12. Moreover, although an EEPROM is used as the non-volatile memory 12, the present invention is not limited to the EEPROM. Any ROM can be a candidate for use as the non-volatile memory 12 as long as it is rewritable, such as a flash memory, a FAMOS (Floating Avalanche MOS), and a SAMOS (Stacked-gate Avalanche MOS).

In addition, the bias control circuit 2 is implemented using a phone DSP or a controlling CPU outside the HPA module 1 in the embodiment of the present invention, but it can be further contemplated that the bias control circuit 2 can be configured to be a circuit dedicated to the exclusive purpose of bias current control and incorporated in the HPA module 1.

As described above, an HPA module of the present invention incorporates a non-volatile memory therein and has pre-recorded static characteristic data of the HPA in the non-volatile memory before it is put on the market. In operation, the data is read and the output power of the HPA is controlled based on the individual static characteristics of the HPA. By precisely controlling the DC bias current of the HPA, the life span of a battery can be extended. Especially, the present invention is highly effective in a W-CDMA mobile phone which requires s a high efficiency (low power) power amplifying apparatus.

While the invention has been shown and described with reference to a certain preferred embodiment thereof, it will be understood by those skilled in the art that various changes in form and details may be made therein without departing from the spirit and the scope of the invention as defined by the appended claims.

What is claimed is:

1. A power amplifying apparatus for a mobile phone, comprising:

a power amplifier; and a non-volatile memory for recording an actual static characteristic measurement data of a specific transistor, said specific transistor having the actual static characteristic being arranged in a power amplifying device of the power amplifier, wherein a DC bias current of the transistor is controlled according to the transmission power of the power amplifier according to the static characteristic measurement data.

2. The power amplifying apparatus of claim 1, wherein the DC bias current is controlled by changing a gate voltage applied to the power amplifying device according to the static characteristic data.

3. The power amplifying apparatus of claim 1, wherein the DC bias current is controlled by fixing a gate voltage applied to the power amplifying device by changing a drain voltage applied to the power amplifying device according to the static characteristic data.

4. The power amplifying apparatus of claim 1, wherein the DC bias current is controlled by changing both a gate voltage and a drain voltage applied to the power amplifying device according to the static characteristic data.

5. A power amplifying apparatus for a mobile phone, comprising:

a power amplifier;

a non-volatile memory for recording an actual static characteristic measurement data of a specific transistor that is arranged in a power amplifying device of the power amplifier; and a bias control circuit for controlling a DC bias current of the transistor according to the transmission power of the power amplifier according to the actual static characteristic measurement data of the specific transistor, wherein the power amplifier, the non-volatile memory, and the DC bias control circuit are incorporated in one chip.

6. The power amplifying apparatus of claim 5, wherein the bias control circuit controls the DC bias current by changing a gate voltage applied to the power amplifying device according to the static characteristic data.

7. The power amplifying apparatus of claim 6, wherein the bias control circuit controls the DC bias current by fixing a gate voltage applied to the power amplifying device and by changing a drain voltage applied to the power amplifying device according to the static characteristic data.

8. The power amplifying apparatus of claim 5, wherein the bias control circuit controls the DC bias current by changing both a gate voltage and a drain voltage applied to the power amplifying device according to the static characteristic data.

* * * * *